(12) United States Patent
Wang et al.

(10) Patent No.: US 10,840,926 B2
(45) Date of Patent: Nov. 17, 2020

(54) AMPLITUDE CALIBRATED OSCILLATOR DEVICE

(71) Applicant: Stichting IMEC Nederland, Eindhoven (NL)

(72) Inventors: XiaoYan Wang, Eindhoven (NL); Kia Salimi, Eindhoven (NL)

(73) Assignee: Stichting IMEC Nederland, Eindhoven (NL)

(*) Notice: Subject to any disclaimer, the term of this patent is extended or adjusted under 35 U.S.C. 154(b) by 0 days.

(21) Appl. No.: 16/503,690

(22) Filed: Jul. 5, 2019

(65) Prior Publication Data
US 2020/0014392 A1    Jan. 9, 2020

(30) Foreign Application Priority Data
Jul. 6, 2018    (EP) ..................................... 18182245

(51) Int. Cl.
| | | |
|---|---|---|
| *H03L 5/00* | (2006.01) | |
| *H03L 7/24* | (2006.01) | |
| *H03B 5/12* | (2006.01) | |
| *H03B 5/36* | (2006.01) | |

(52) U.S. Cl.
CPC ............... *H03L 7/24* (2013.01); *H03B 5/124* (2013.01); *H03B 5/1215* (2013.01); *H03B 5/1228* (2013.01); *H03B 5/1278* (2013.01); *H03B 5/364* (2013.01)

(58) Field of Classification Search
CPC ....... H03L 7/24; H03B 5/1215; H03B 5/1228; H03B 5/124; H03B 5/1278; H03B 5/364; H03B 5/1212

USPC ...... 331/109, 117 R, 117 FE, 167, 182, 183, 331/186
See application file for complete search history.

(56) References Cited

U.S. PATENT DOCUMENTS

| | | | |
|---|---|---|---|
| 7,511,590 B1 * | 3/2009 | Gehring | ................... H03B 5/36 331/116 R |
| 8,203,393 B1 | 6/2012 | Leon | |
| 9,054,637 B1 * | 6/2015 | Mittal | ..................... H03B 5/364 |
| 2005/0174183 A1 | 8/2005 | Tachibana et al. | |

(Continued)

FOREIGN PATENT DOCUMENTS

EP    3010150 A1    4/2016

OTHER PUBLICATIONS

European Search Report, European Patent Application No. 18182245. 3, dated Feb. 11, 2019, 8 pages.

(Continued)

*Primary Examiner* — Richard Tan
(74) *Attorney, Agent, or Firm* — McDonnell Boehnen Hulbert & Berghoff LLP (57) ABSTRACT

An example oscillator device comprises (i) an oscillation circuit arranged for generating and outputting an oscillation signal and comprising an active circuit to ensure oscillation is maintained, (ii) a voltage-to-current conversion replica circuit of the active circuit arranged for receiving the oscillation signal and for outputting a current proportional to the oscillation signal, (iii) biasing means arranged to generate a constant bias current to activate the oscillation circuit, and (iv) subtraction means for subtracting the current proportional to the oscillation signal from the bias current, thereby obtaining a resulting current which can be used for adapting the oscillation signal's amplitude.

18 Claims, 4 Drawing Sheets

(56) References Cited

U.S. PATENT DOCUMENTS

| | | |
|---|---|---|
| 2007/0103242 A1 | 5/2007 | Wu |
| 2008/0048793 A1 | 2/2008 | Koerner |
| 2009/0224836 A1 | 9/2009 | Orberk et al. |
| 2012/0218048 A1* | 8/2012 | Akaike .................... H03L 1/00 331/2 |
| 2013/0271226 A1 | 10/2013 | Sinoussi |

OTHER PUBLICATIONS

Siriburanon, Teerachot et al., "A Constant-Current-Controlled Class-C VCO Using a Self-Adjusting Replica Biasing Scheme", Proceedings of the 8th European Microwave Integrated Circuits Conference, Oct. 6-8, 2013, pp. 109-112.

* cited by examiner

AMPLITUDE CALIBRATED OSCILLATOR DEVICE

CROSS-REFERENCE TO RELATED APPLICATION

The present application is a non-provisional patent application claiming priority to European Patent Application No. 18182245.3 filed Jul. 6, 2018, the contents of which are hereby incorporated by reference.

TECHNICAL FIELD

The present disclosure is generally related to the field of oscillators and more specifically to oscillator devices for which the oscillation swing can be controlled.

BACKGROUND

In modern communication applications, a low noise, low jitter, highly stable on-chip local oscillator operating at the carrier frequency is desirable in radio transceivers. Oscillators with a resonant tank, e.g., LC oscillators and crystal oscillators, are largely adopted because of their high performance and relatively low power consumption, on top of well-studied design trade-offs and methodologies.

The design of low-phase-noise oscillators has challenged radio frequency circuit designers for decades. An important design parameter of oscillator devices is the oscillation amplitude (also called oscillation swing). The oscillation swing has an impact on the phase noise and power consumption of the oscillator. It is also related to the way the next stage is driven. For example, when the oscillation signal swing is low, the oscillator operates in the current limited region and the phase noise improves when the oscillator bias current is increased, until the oscillator device enters a voltage limited region, where the oscillation signal swing cannot be further increased and the phase noise starts to degrade. In addition, sufficient signal amplitude must be provided to the following oscillator stage, which can be a frequency divider or a buffer, to help ensure proper operation of the system. On the other hand, the oscillator consumes more power to achieve a larger oscillation amplitude. In practical radio systems, the oscillator swing is determined as the trade-off between the power consumption, phase noise, and the requirements of the next stage.

To improve the performance and power consumption, the oscillation swing can be tightly controlled. However, the oscillation signal swing depends on a multitude of factors, including process variation of both the active transistors and the passive devices, variations in the supply voltage of the circuits, as well as the ambient temperature. These factors can be referred to as the process, voltage, and temperature (PVT) variations. The variation of the PVT corners can produce a significant effect on the performance of an integrated circuit (IC). The targeted oscillation swing obtained by simulation is rarely the same as the actual swing after fabrication. Sometimes oscillators even fail to oscillate because the loss in the circuit is larger than estimated due to PVT variations. In oscillator devices with a wide tuning range, there is an additional problem: the oscillation swing changes with frequency, as a result of frequency-dependent LC tank loss and transistor characteristics. In order to leave sufficient margin, circuit designers often leave a margin during the design, so that the oscillation signal swing is larger than necessary, with consequently higher power consumption.

Hence, trimming or calibration can be used to adjust the integrated circuit settings. One of the key parameters that can be calibrated to obtain improved circuit performance is the active transistor threshold voltage.

One calibration/trimming method known in the art to test IC PVT corners is based on implementing a ring oscillator for threshold voltage calibration. The calibration results are determined prior to oscillator operation. These results are later used to bias the oscillator. Therefore, the oscillator can then be seen as a self-biased block.

Amplitude controlled oscillators are not so commonly used in the art. The traditional amplitude level control (ALC) circuits control the amplitude level in an automated way based on a feedback loop, where a peak detector determines the oscillation swing level, compares it to a voltage reference, and adjusts the bias of active devices providing the energy to the resonator. In such schemes, no link exists between the voltage reference that sets the amplitude swing and design parameters of the active devices in the oscillator. A suitable oscillation amplitude to reach low-phase-noise is then obtained through an empirical method, adjusting the voltage reference value. This may not be adapted to the optimum operation mode of the active part. Another drawback is that the oscillation swing may become instable.

Other recent works make use of a digitally-controlled bias circuit, eliminating the loop noise contribution as well as reducing any risk of envelope instability.

In the paper "*A Constant-Current-Controlled Class-C VCO using a Self-Adjusting Replica Biasing Scheme*" (T. Siriburanon et al., Proc. 8th European Microwave Integrated Circuits Conference, 2013, pp. 109-112), a constant-current-controlled class-C VCO using a self-adjusting replica biasing scheme is proposed. The VCO core comprises resistor-capacitor (RC) biasing. A replica biasing circuit comprises replica transistors to sense a bias current in the active part.

In EP 3010150, an oscillator device is presented in which a reference generating circuit generates a reference voltage signal and comprises an additional biasing circuit to derive a reference bias current signal which is compared with the VCO tail current. The resulting control signal is used for adjusting the VCO tail current.

Hence, there is a need to provide in an integrated circuit an oscillator device for which, given a certain power budget, the phase noise can be kept low.

SUMMARY

Example embodiments of the present disclosure provide for an oscillator device for which amplitude calibration can be performed without requiring an external reference.

In a first aspect, the disclosure relates to an oscillator device comprising (i) an oscillation circuit arranged for generating and outputting an oscillation signal and comprising an active circuit to ensure oscillation is maintained, (ii) a voltage-to-current conversion replica circuit of the active circuit arranged for receiving the oscillation signal and for outputting a current proportional to the oscillation signal, (iii) biasing means arranged to generate a constant bias current to activate the oscillation circuit, and (iv) subtraction means for subtracting the current proportional to the oscillation signal from the bias current, thereby obtaining a resulting current which can be used for adapting the amplitude of the oscillation signal.

The present disclosure allows for improvements to the performance of the oscillator device. It also allows tracking PVT variations. By means of the replica circuit of the active circuit and biasing means an amplitude reference can be created. The biasing means provides a constant bias current. This bias current is set high enough to ensure oscillation start up in all circumstances. The difference between the bias current and the current proportional to the oscillation signal is used to steer the amplitude of the oscillation.

In some example embodiments, the oscillation circuit comprises a resonant tank.

In some example embodiments, the active circuit is a differential transconductor.

In some example embodiments, the oscillation circuit further comprises biasing means arranged to receive the resulting current in order to bias the oscillator circuit. The resulting current is copied to the biasing means via a first and a second current mirror.

In some example embodiments, the oscillator device comprises a process, voltage, and temperature read-out circuit arranged for receiving the resulting current and for outputting a biasing signal in accordance with the received resulting current to the oscillation circuit.

In some example embodiments, the read-out circuit is arranged for deriving a digital code representative of the received resulting current and for generating the biasing signal in accordance with the digital code.

In some example embodiments, the oscillator device comprises storage means for storing that digital code.

In some example embodiments, the read-out circuit comprises at least one of an ADC, a DAC, or a counter.

In some example embodiments, the oscillator device is implemented as a class-C oscillator. The ALC scheme can be applied for a class-C oscillator without the need of a start-up circuit.

The disclosure also relates to a frequency synthesizer circuit or clock and data recovery circuit comprising an oscillator device as previously described.

For purposes of summarizing the disclosure and the advantages achieved over the prior art, certain objects and advantages of the disclosure have been described herein above. Of course, it is to be understood that not necessarily all such objects or advantages may be achieved in accordance with any particular embodiment of the disclosure. Thus, for example, those skilled in the art will recognize that the disclosure may be embodied or carried out in a manner that achieves or optimizes one advantage or group of advantages as taught herein without necessarily achieving other objects or advantages as may be taught or suggested herein.

The above and other aspects of the disclosure will be apparent from and elucidated with reference to the embodiment(s) described hereinafter.

BRIEF DESCRIPTION OF THE DRAWINGS

The disclosure will now be described further, by way of example, with reference to the accompanying drawings, wherein like reference numerals refer to like elements in the various figures.

DETAILED DESCRIPTION

The present disclosure will be described with respect to particular embodiments and with reference to certain drawings but the disclosure is not limited thereto but only by the claims.

Furthermore, the terms first, second, and the like in the description and in the claims are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

It is to be understood that the term "comprising," used in the claims, should not be interpreted as being restricted to the means listed thereafter; it does not exclude other elements or steps. It is thus to be interpreted as specifying the presence of the stated features, integers, steps, or components as referred to, but does not preclude the presence or addition of one or more other features, integers, steps, components, or groups thereof. Thus, the scope of the expression "a device comprising components A and B" should not be limited to devices consisting only of components A and B. It means that with respect to the present disclosure, the only relevant components of the device are A and B.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Furthermore, the particular features, structures, or characteristics may be combined in any suitable manner, as would be apparent to one of ordinary skill in the art from this disclosure, in one or more embodiments.

Similarly it should be appreciated that in the description of example embodiments of the disclosure, various features of the disclosure are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed disclosure requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this disclosure.

Furthermore, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

It should be noted that the use of particular terminology when describing certain features or aspects of the disclosure should not be taken to imply that the terminology is being re-defined herein to be restricted to include any specific characteristics of the features or aspects of the disclosure with which that terminology is associated.

In the description provided herein, numerous specific details are set forth. However, it is understood that embodiments of the disclosure may be practiced without these specific details. In other instances, well-known methods, structures, and techniques have not been shown in detail in order not to obscure an understanding of this description.

An oscillator device comprises an oscillator circuit, which can include a passive resonant tank and an active circuit. The resonant tank resonates at a frequency determined by the time constant of the tank, while the active circuit compensates for the energy loss of the resonant tank so that resonance can be maintained. Once the resonance is excited and maintained, the circuit is oscillating.

The oscillation amplitude (swing) is determined by the supply voltage, transistor characteristics, oscillator topology, and biasing of the active circuit. Because of process, voltage, and temperature (PVT) variations, the amplitude of oscillation can be difficult to accurately predict. On the other hand, to meet the desired performance and power budget, it is useful to detect and control the oscillation amplitude at a predefined level.

Oscillator devices exhibit a trade-off between the output amplitude/swing level and phase noise. Indeed, low-phase-noise design can be achieved with either a high quality-factor resonator or a large signal swing. However, even though the latter is power hungry, an optimum phase-noise region can be found within a certain power consumption budget. This consideration has given birth to the class-C operation mode of an oscillator, where the active devices inject an impulse-like current to the resonator, while staying in the saturation (for MOS transistors) operating region and therefore facilitating operation in an improved and/or optimum phase-noise region with lower power consumption. However, such Class-C type oscillators require a start-up circuit to assure the start of the oscillations.

The present disclosure proposes an oscillator device for which a reference-free PVT calibration loop is implemented based on the oscillator output amplitude, so that the oscillator performance is improved and/or optimized and the PVT variations can be tracked.

In the ALC scheme applied in the oscillator device, an amplitude reference is built using a replica of the active devices in the oscillator circuit. The trade-off between the swing and phase noise is then naturally maintained in spite of PVT variations. The calibrated PVT information can be, in addition, used as a reference to improve and/or optimize the entire integrated circuit.

Figure 1:
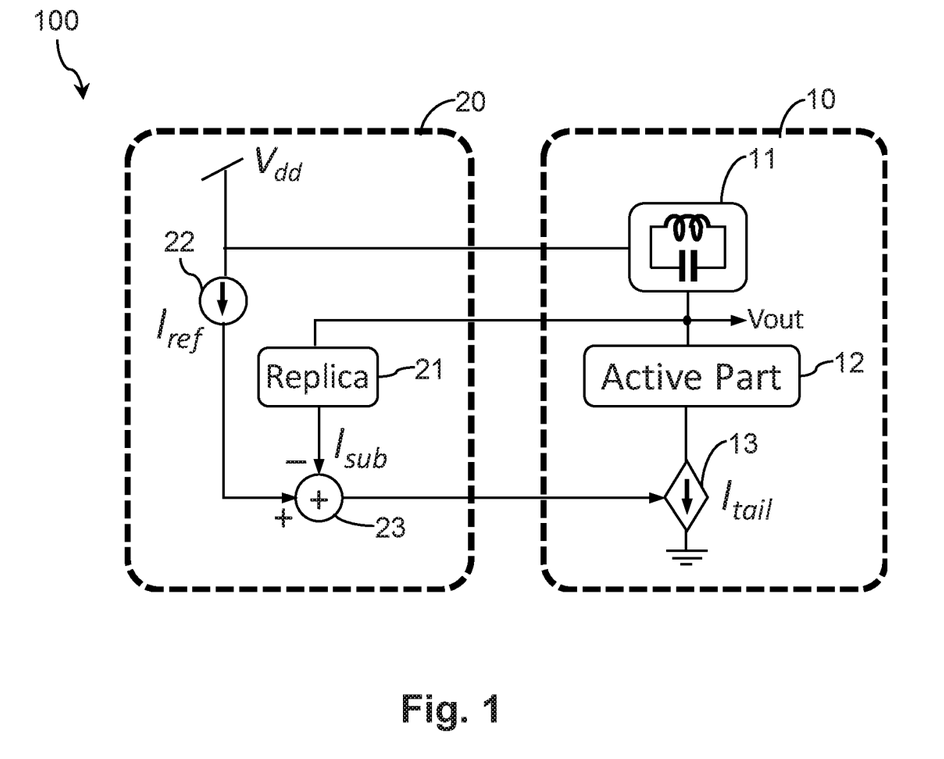
FIG. 1 illustrates a block diagram of an oscillator device, according to an example embodiment.

A generic scheme of a device according to this disclosure is shown in FIG. 1. In line with the discussion above, the oscillation device 100 comprises an oscillation circuit 10 with a passive resonant tank 11 and an active circuit 12. A level control scheme is obtained by adding a voltage-to-current conversion replica circuit 21 of the active devices in the oscillation circuit and biasing means 22. The oscillation device 100 operates in current-mode. The replica circuit 21 outputs a rectified current $I_{sub}$ which is proportional to the oscillation amplitude as explained below. The biasing means 22 in the oscillation device 100 provide a constant main bias current $I_{ref}$. This is different from certain prior art schemes where a bias current with constant transconductance $g_m$ is considered instead. The current $I_{sub}$ is zero at start-up. The main bias current $I_{ref}$ is set high enough to ensure the oscillation starts up in all conditions. As shown in FIG. 1, the rectified current $I_{sub}$ is subtracted from the main bias current $I_{ref}$. The resulting current $I_{tail}$ is then used to determine the optimum amplitude for a low phase noise output.

The scheme of FIG. 1 applies a self-biased or clamping-like control mechanism to limit the oscillation amplitude. A built-in reference is used rather than an external reference. The ALC scheme forces the oscillator to operate in the current limited region. As a current-mode design is adopted, the number of AC nodes in the circuit remains the same. Therefore, the stability is not degraded, in contrast to traditional feedback loops.

Figure 2:
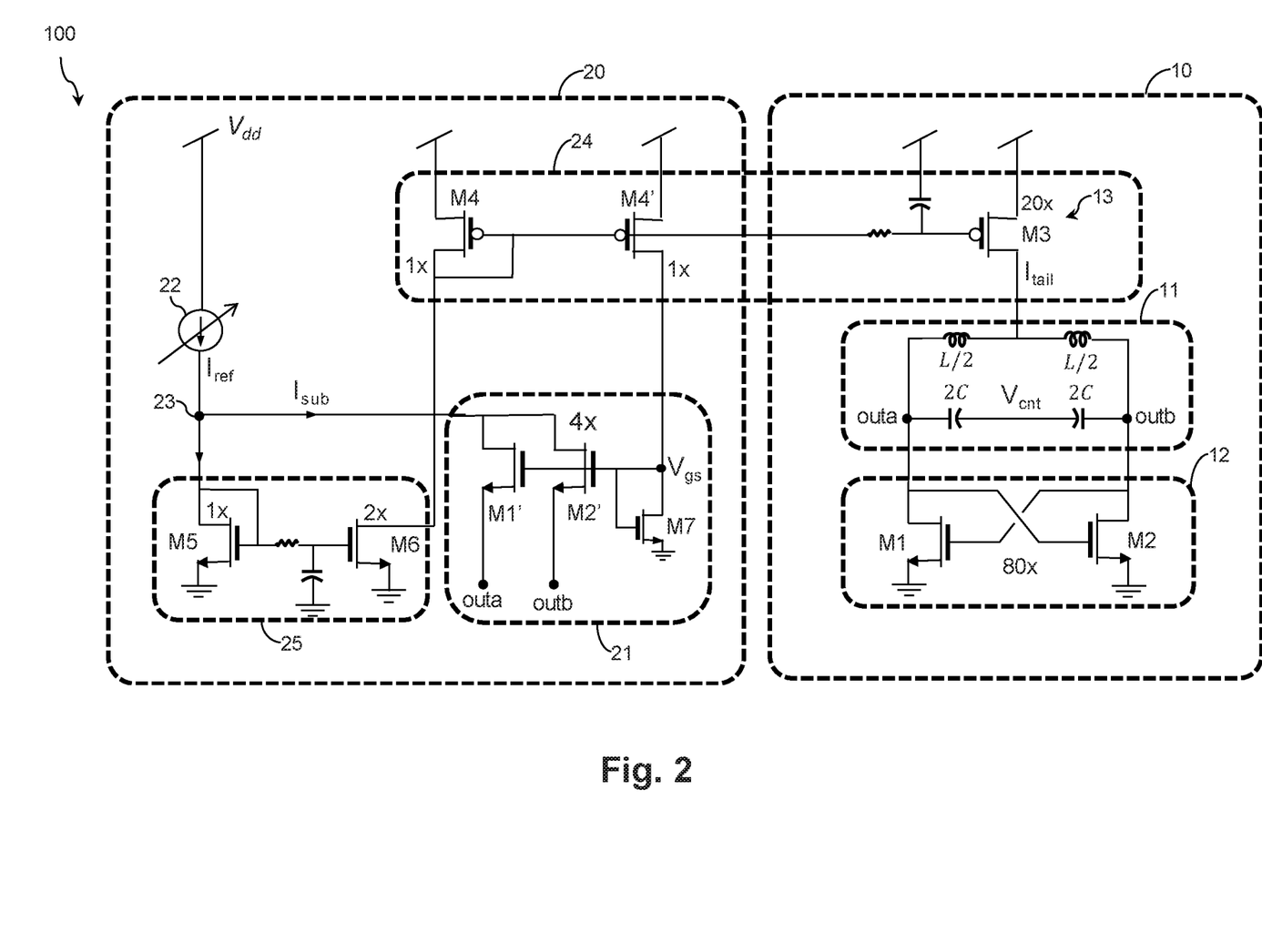
FIG. 2 illustrates a practical implementation of the oscillator device, according to an example embodiment.

FIG. 2 illustrates a possible practical implementation of the generic scheme of the oscillator device 100 as shown in FIG. 1. A cross-coupled LC oscillator is used containing a passive resonance tank 11, which can be a parallel LC tank, and a differential transconductor 12 with a tail current source 13. The LC tank 11 resonates at the desired oscillation frequency, while the transconductor 12 compensates the LC tank loss so that the oscillation can be excited and maintained. The oscillator output signal approaches an ideal sinusoid wave at the resonance frequency. With ideal linear transconductors, the oscillation signal swing theoretically grows exponentially over time without bound, which means the oscillation signal swing will approach infinity as time elapses. In reality, due to non-linearity in transistors of the transconductor 12, the oscillation signal swing is limited by the voltage supply and bias conditions.

Various topologies can be considered for the transconductor 12: it can, for example, be built with NMOS transistors, PMOS transistors, or N- or P-type bipolar transistors. In FIG. 2 an implementation with NMOS cross-coupled transistors is shown. The current source transistor M3 provides tail current $I_{tail}$ to the NMOS transistors M1, M2. When oscillation starts, the oscillation amplitude at the output nodes of the oscillator outa, outb increases, and the signal levels on the NMOS transistors also increase, i.e., the gate-source voltage amplitudes on M1 and on M2 increase. Due to the non-linearity of the transistors M1 and M2, the gate-source voltage amplitude increases together with the oscillation amplitude. Therefore, an indication of the high frequency oscillation signal amplitude at the oscillator output is obtained at low frequency from the voltage level of the tail current used for biasing the active transistors.

FIG. 2 also indicates the biasing means 22, the voltage-to-current conversion replica circuit 21, and a current mirror 24. The oscillator outputs, nodes outa and outb, are connected to voltage-to-current conversion replica circuit 21, which converts the output voltage $V_{out}$ to a current $I_{sub}$ with amplitude proportional to the oscillator swing. The voltage at the oscillator output is provided to the source of transistors M1', M2' of the replica circuit 21. As the source voltage of transistors M1', M2' changes with the change of voltage swing at the oscillator output nodes, the current $I_{sub}$ flowing through them is varied, which thus realizes a voltage-to-current conversion.

The diode-mounted device M7 in the replica circuit 21 provides a static gate-source voltage $V_{gs}$ mimicking the one in the active part 12 of oscillator 100, i.e., at transistors M1, M2. The constant reference current source 22 generates a bias current $I_{ref}$ which is then subtracted by the current $I_{sub}$ from the replica circuit 21 to output a resulting current. The subtraction is done at node 23. The resulting current is then copied via the current mirror 25 comprising transistors M5 and M6 and the current mirror 24 comprising transistors M4 and M3 to provide $I_{tail}$ to bias the oscillator via transistor M3. The resulting current $I_{tail}$ represents the difference between the main bias current $I_{ref}$ and the rectified current $I_{sub}$ (i.e., $I_{tail} \approx I_{ref} - I_{sub}$).

In addition, current mirror 24 comprises transistor M4', which copies the resulting current into the replica circuit 21 so that the replica circuit 21 is biased in the same manner as the oscillation circuit 10. The current $I_{sub}$ is initially equal to zero, and the reference current $I_{ref}$ is set so that the initial value of the $I_{tail}$ current ensures oscillator startup.

Once started, the oscillator output amplitude reaches its maximum, i.e., $V_{outa} = V_{gs'} + V_{amp}$. $V_{amp}$ thereby denotes the amplitude of the oscillator signal. The gate source voltage $V_{gs'}$ represents the DC value at the oscillator output node, which through the current mirror 24 is similar to $V_{gs}$ of M7 (i.e., $V_{gs,M7}$). The peak-to-peak voltage of the oscillator signal is proportional to the threshold voltage $V_{th}$. For simplicity, $V_{th}$ is presumed to be the same for both M1 and M2 transistors. The output voltage level $V_{out}$ reflects the $V_{th}$ variation across PVT and can be used as a reference voltage for the ALC circuit.

One can therefore derive the following:

$$V_{outa} = V_{gs',M2} + V_{amp}$$

$$V_{outb} = V_{gs',M1} - V_{amp},$$

For $V_{outa}$, $V_{gs'}$ represents the DC value at the output node outa, which is equivalent to the $V_{gs}$ of M2. As M7 in the replica circuit 21 replicates M1 (M2) in the oscillator 10, the DC value of the $V_{gs}$ voltage of M7 is similar to $V_{gs'}$. The same applies for $V_{outb}$, where $V_{gs}$ represents the DC value at the output node outb, which is equivalent to the $V_{gs}$ of M1, and hence also equivalent to the DC value of the $V_{gs}$ voltage of M7. Therefore, the currents $I_{tail}$ and $I_{sub}$ can be derived as follows:

$$I_{tail} = I_{M1} + I_{M2}$$

$$I_{M1} = f(V_{outb} - V_{th}) = f(V_{gs',M1} - V_{th} - V_{amp})$$

$$I_{M2} = f(V_{outa} - V_{th}) = f(V_{gs',M2} - V_{th} + V_{amp})$$

$$I_{sub} = I_{M1'} + I_{M2'}$$

$$I_{M1'} = f(V_{gs,M7} - V_{outa} - V_{th}) = f(V_{gs,M7} - V_{gs',M2} - V_{amp} - V_{th})$$
$$= f(-V_{amp} - V_{th})$$

$$I_{M2'} = f(V_{gs,M7} - V_{outb} - V_{th}) = f(V_{gs,M7} - V_{gs',M1} - V_{amp} - V_{th})$$
$$= f(V_{amp} - V_{th})$$

where $V_{gs,M7}$ is a replica of $V_{gs',M1}$ (and $V_{gs',M2}$) and holds a similar value, thus they cancel each other in the above equations. M1 and M2 conduct alternatively and so do M1' and M2'. Hence, when M1 and M1' are conducting, one obtains for $I_{tail}$ and $I_{sub}$, respectively:

$$I_{tail} = f(V_{gs'} - V_{th} - V_{amp})$$

and at the same time $$I_{sub} = f(-V_{amp} - V_{th}).$$

A higher oscillator amplitude $V_{amp}$ leads to a lower $I_{sub}$, which is subtracted from $I_{ref}$. Through the current mirror, $I_{tail}$ starts to increase, thus increasing the oscillator amplitude $V_{amp}$. When M2 and M2' are conducting one gets:

$$I_{tail} = f(V_{gs'} - V_{th} + V_{amp})$$

and at the same time $$I_{sub} = f(V_{amp} - V_{th}).$$

A higher oscillator amplitude $V_{amp}$ leads to a higher $I_{sub}$, which is subtracted from $I_{ref}$. Through the current mirror 24, $I_{tail}$ starts to reduce, thus reducing the oscillator amplitude $V_{amp}$. In this way, a closed loop, reference-free amplitude level control is facilitated.

The proposed ALC scheme helps assure the amplitude of the oscillation signal is maintained so that an optimum trade-off between low phase noise and power consumption can be achieved. This ALC scheme applies to any class type oscillators. However, it also applies to class-C oscillators. For a class-C oscillator, the DC voltage at output of the oscillator should be lower than the threshold voltage of the active pair in oscillator. The proposed calibration scheme can start with the maximum current ($I_{sub}$=0 in the very beginning), which gives a DC voltage at the gate of both M1 and M2 higher than $V_{th,M1}$ and $V_{th,M2}$. Therefore, the oscillator starts oscillation in a class-A/AB mode. With the help of the ALC scheme, the oscillator is regulated into class-C mode, meaning the DC voltage at the gate of M1 and M2 is lower than $V_{th,M1}$ and $V_{th,M2}$. This way the start-up of the Class-C oscillator is achieved without an extra start-up circuit.

Figure 3:
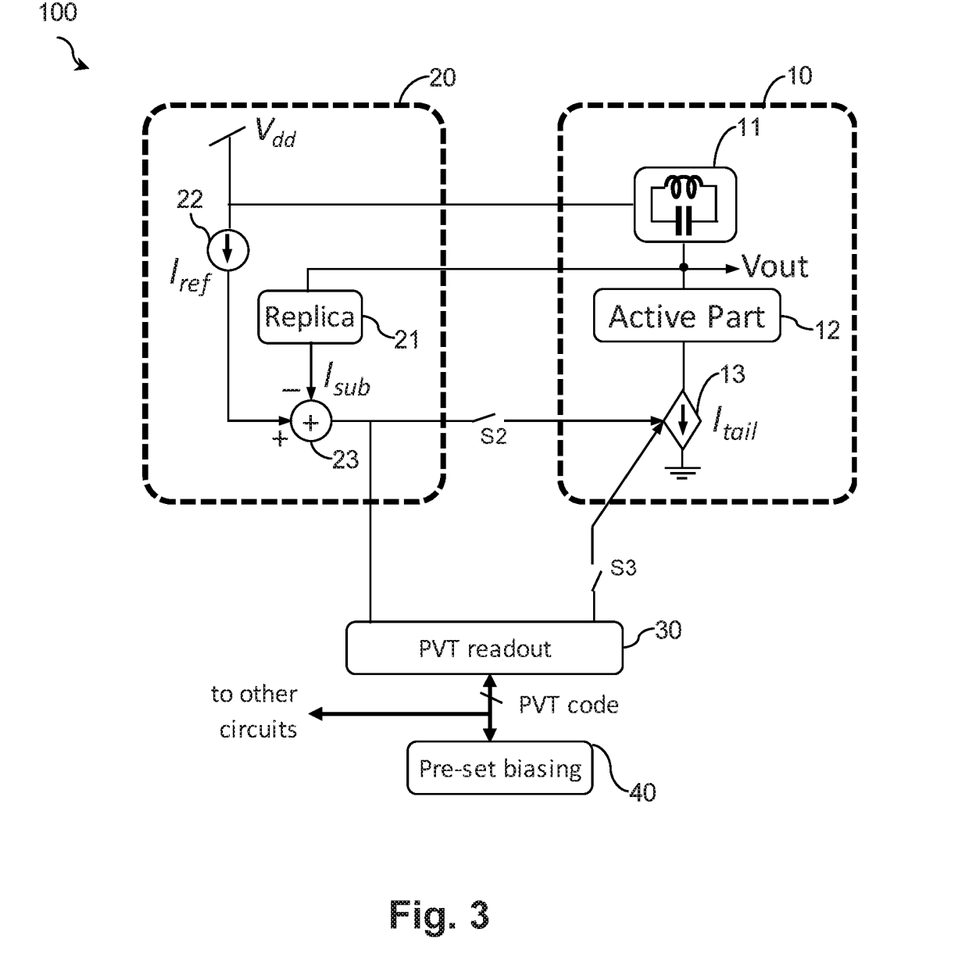
FIG. 3 illustrates a block diagram of an oscillator device with PVT readout circuit, according to an example embodiment.

FIG. 3 shows an example implementation of the oscillator device 100 of FIG. 1 but now with a PVT read-out circuit 30. The PVT readout block 30 extracts the end results of the amplitude calibration, which represent the optimum biasing current for the oscillator 10 in the form of a digital code (see PVT code). The digital code may be stored in a pre-set biasing block 40 for later use. After calibration, the calibration circuit 20 is shut down, while the oscillator 10 is biased with the stored PVT code converted to a biasing voltage via a DAC. By doing so, the current consumed by the calibration circuit 20 is saved during the normal operation of the oscillator 10, thus lowering the total power consumption of the whole implementation.

Figure 4:
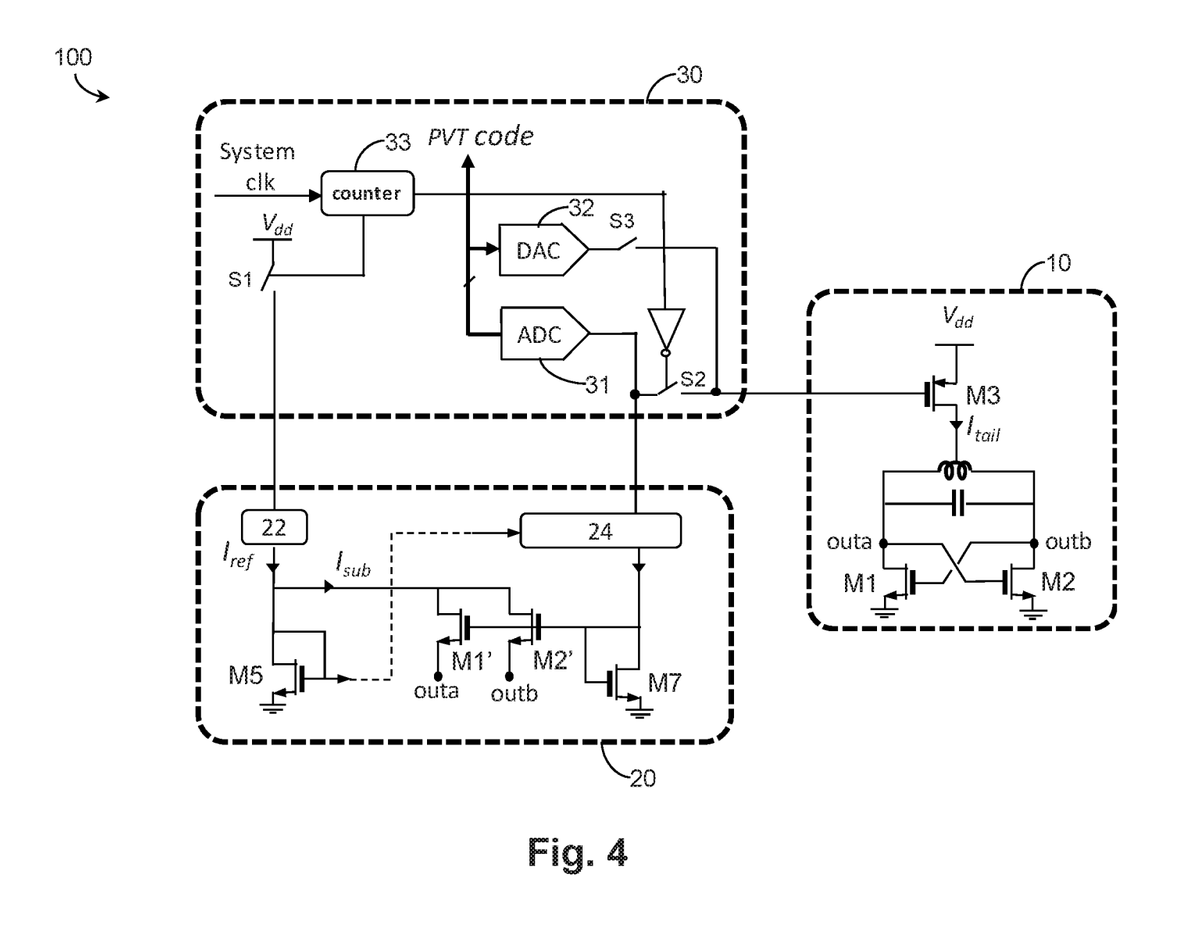
FIG. 4 illustrates a practical implementation of the oscillator device with a PVT readout circuit, according to an example embodiment.

FIG. 4 shows a more detailed scheme of FIG. 3. The same functional blocks as in FIG. 2 can be recognized. The PVT readout circuit 30 comprises an ADC 31, a DAC 32, a counter 33, and switches S1 to S3 to switch on/off to different biasing schemes during different phases, divided into a calibration phase and an operation phase.

During the calibration phase, switches S1 and S2 are closed and switch S3 is open. The ALC block 20 regulates the oscillator current to the optimum point for phase noise performance and current consumption. The counter 33 works as a low frequency system clock and controls the timing. By the end of the calibration phase, the gate voltage of M3 (representing the optimum biasing voltage for M3) is read out via the ADC 31 and saved in a memory (not shown in FIG. 4) as a digital code (PVT code). At the end of the calibration phase, switches S1 and S2 are opened to switch off the calibration block 20 in order to save power.

During the operation phase, switch S3 is closed. This allows the saved PVT code to be read out from the memory and fed back via the DAC 32 to bias the oscillator 10.

The oscillator device of this disclosure employs a reference-free, automated PVT calibration loop, based on amplitude of the oscillator output, to track the PVT variations. The calibration loop is implemented as an amplitude level controller (ALC) for a class-C based oscillator, which is tuned to a current-voltage point optimized in view of the phase noise performance versus current consumption. The PVT corner calibration can so be embraced in the operational mode, before each PLL locking, and the oscillator can be automatically set to its optimal working point. Further, the proposed approach does not need a reference voltage level to calibrate the oscillator amplitude.

The oscillator device as described above can be used in various applications: frequency synthesizers employed in radio communication systems, clock and data recovery circuits used in wireline transceivers, voltage/digitally controlled oscillators (V/DCO) incorporated into a phase-locked-loop (PLL), etc.

While the disclosure has been illustrated and described in detail in the drawings and foregoing description, such illustration and description are to be considered illustrative or exemplary and not restrictive. The foregoing description details certain embodiments of the disclosure. It will be appreciated, however, that no matter how detailed the foregoing appears in text, the disclosure may be practiced in many ways. The disclosure is not limited to the disclosed embodiments.

Other variations to the disclosed embodiments can be understood and effected by those skilled in the art in practicing the claimed disclosure, from a study of the drawings, the disclosure and the appended claims. In the claims, the word "comprising" does not exclude other elements or steps, and the indefinite article "a" or "an" does not exclude a plurality. A single processor or other unit may fulfill the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

What is claimed is:

1. An oscillator device comprising:
   an oscillation circuit arranged for generating and outputting an oscillation signal and comprising an active circuit for maintaining oscillation of the oscillation signal;
   a voltage-to-current conversion replica circuit of the active circuit arranged for receiving the oscillation signal and for outputting a current proportional to the oscillation signal;
   biasing means arranged to generate a constant bias current to activate the oscillation circuit;
   subtraction means for subtracting the current proportional to the oscillation signal from the bias current, thereby obtaining a resulting current; and
   a process, voltage, and temperature (PVT) read-out circuit arranged for receiving the resulting current and for outputting a biasing signal in accordance with the received resulting current to the oscillation circuit, thereby adapting an amplitude of the oscillation signal.

2. The oscillator device of claim 1, wherein the oscillation circuit further comprises a resonant tank.

3. The oscillator device of claim 1; wherein the active circuit comprises a differential transconductor.

4. The oscillator device of claim 1, wherein the oscillation circuit further comprises a second biasing means arranged for receiving the resulting current to bias the oscillator circuit.

5. The oscillator device of claim 4, herein the resulting current is copied to the second biasing means via a first current mirror and a second current mirror.

6. The oscillator device of claim 1, wherein the PVT read-out circuit is arranged for deriving a digital code representative of the received resulting current and for generating the biasing signal in accordance with the digital code.

7. The oscillator device of claim 6, further comprising storage means for storing the digital code.

8. The oscillator device of claim 1, wherein the PVT read-out circuit comprises at least one of an ADC, a DAC, or a counter.

9. The oscillator device of claim 1, wherein the oscillator device is implemented as a class-C oscillator.

10. A frequency synthesizer circuit or clock and data recovery circuit comprising the oscillator device of claim 1.

11. A method comprising:
    generating and outputting, by an oscillation circuit, an oscillation signal, wherein the oscillation circuit comprises an active circuit for maintaining oscillation of the oscillation signal;
    receiving, by a voltage-to-current conversion replica circuit of the active circuit, the oscillation signal;
    outputting, by the voltage-to-current conversion replica circuit of the active circuit, a current proportional to the oscillation signal;
    generating, by biasing means, a constant bias current to activate the oscillation circuit;
    subtracting, by subtraction means, the current proportional to the oscillation signal from the bias current, thereby obtaining a resulting current;
    receiving, by a process, voltage, and temperature (PVT) read-out circuit, the resulting current; and
    using the resulting current to adapt an amplitude of the oscillation signal by outputting, by the PVT read-out circuit, a biasing signal in accordance with the received resulting current to the oscillation circuit.

12. The method of claim 11, wherein the oscillation circuit further comprises a resonant tank, and wherein generating the oscillation signal comprises generating the oscillation signal using the resonant tank.

13. The method of claim 11, wherein the active circuit comprises a differential transconductor, and wherein maintaining oscillation of the oscillation signal comprises using the differential transconductor to maintain oscillation of the oscillation signal.

14. The method of claim 11, wherein the oscillation circuit further comprises a second biasing means, and wherein the method further comprises receiving and using, by the second biasing means, the resulting current to bias the oscillator circuit.

15. The method of claim 14, further comprising copying the resulting current to the second biasing means via a first current mirror and a second current mirror.

16. The method of claim 11, further comprising:
    deriving, by the PVT read-out circuit, a digital code representative of the received resulting current; and
    generating, by the PVT read-out circuit, the biasing signal in accordance with the digital code.

17. The method of claim 16, further comprising storing the digital code in a data storage.

18. The method of claim 11, wherein the PVT read-out circuit comprises at least one of an ADC, a DAC, or a counter.

* * * * *